United States Patent [19]
Tachibana

[11] Patent Number: 4,837,412
[45] Date of Patent: Jun. 6, 1989

[54] KEYBOARD OF A MEMBRANE CONTACT TYPE

[75] Inventor: Sadao Tachibana, Tokyo, Japan

[73] Assignee: Oki Electric Industry Co., Ltd., Tokyo, Japan

[21] Appl. No.: 208,721

[22] Filed: Jun. 20, 1988

[30] Foreign Application Priority Data

Jun. 29, 1987 [JP] Japan ............................ 62-98590[U]

[51] Int. Cl.⁴ ...................... H01H 9/00; H01H 13/70; H05K 1/00
[52] U.S. Cl. .................................. 200/5 A; 200/292; 200/512; 361/398
[58] Field of Search .......... 200/5 R, 5 A, 6 A, 159 B, 200/292, DIG. 1; 361/398; 400/479–479.2

[56] References Cited

U.S. PATENT DOCUMENTS

| | | | |
|---|---|---|---|
| 4,246,452 | 1/1981 | Chandler | 200/292 X |
| 4,356,358 | 10/1982 | Fukukura | 200/5 A |
| 4,425,484 | 1/1984 | Fukukura | 200/292 X |
| 4,484,039 | 11/1984 | Salie | 200/292 X |
| 4,623,768 | 11/1986 | Gnant | 200/5 A X |

FOREIGN PATENT DOCUMENTS

56-165328 12/1981 Japan .
59-170922 11/1984 Japan .

*Primary Examiner*—J. R. Scott
*Attorney, Agent, or Firm*—Wenderoth, Lind & Ponack

[57] ABSTRACT

A keyboard of a membrane contact type comprises a membrane contact unit having movable contacts, fixed contacts disposed respectively opposite to the movable contacts, and a printed wiring board having electronic circuit elements and provided with printed wiring lines. The membrane contact unit comprises a flexible, insulating, membranous substrate having movable contacts formed in a movable contact section and fixed contacts formed in a fixed contact section demarcated by a folding line, in the same surface as the movable contacts and arranged symmetrically about the folding line. First and second wiring lines connect the movable contacts and the fixed contacts respectively in a predetermined connecting pattern. A first terminal section having first terminals is connected respectively to the first wiring lines, and a second terminal section having second terminals is connected respectively to the second wiring lines. The first and second terminal sections are formed near the folding line. U-shaped slits are formed in the substrate so as to embrace the extremities of the first and second terminal sections, respectively, so that the first and second terminal sections project from the folded edge of the membranous substrate when the same is folded along the folding line to facilitate electrically and mechanically connecting the membrane contact unit to the printed wiring board.

3 Claims, 5 Drawing Sheets

KEYBOARD OF A MEMBRANE CONTACT TYPE

BACKGROUND OF THE INVENTION

1. Field of the Invention

The present invention relates to a keyboard of a membrane contact type for use as an input keyboard for electronic equipments such as computers, data processors and word processors.

2. Description of the Prior Art

Japanese Utility Model Laid-Open Publication Nos. 56-165328 and 59-170922 disclose inventions relating to such a keyboard of a membrane contact type.

A membrane contact sheet employed in a conventional keyboard of a membrane contact type, has a flexible insulating membranous substrate having a movable section and a fixed section demarcated by folding along a folding line provided at the center of the substrate.

The movable section has a plurality of movable contacts. The number of the movable contacts is equal to that of keys and the arrangement of the movable contacts corresponds to that of the keys. Each movable contact is moved upon reception of a pressure applied to each key corresponding to the each movable contact. The fixed section has a plurality of fixed contacts. The arrangement of the movable contacts and that of the fixed contacts are symmetrically arranged with each other with respect to the folding line.

A plurality of the movable contacts are divided into a plurality of lateral lines and the movable contacts on each lateral line are connected in series by a wiring line, while a plurality of the fixed contacts are divided into a plurality of longitudinal rows and the fixed contacts on each longitudinal row are connected in series by a wiring line to form a matrix of contacts. The wiring lines lead respectively to terminal sections.

The membrane contact sheet is folded along the folding line so that the printed surfaces of the movable section and the fixed section face each other, an insulating spacer having openings formed at positions respectively corresponding to the contacts is placed between the movable section and the fixed section, and then the movable section and the fixed section are joined adhesively to form a membrane contact unit.

The conventional membrane contact sheet, however, has a disadvantage that a wiring pattern including those wiring lines needs inevitably to be formed via a long way around the arrangement of the fixed contacts to lead the wiring lines of the movable contacts to the terminal section, and thereby the size of the keyboard and the resistances of the wiring lines are increased.

Such a disadvantage may be overcome by providing the terminal section of the movable contacts on the movable section. This is realized by printing patterns of contacts and the wiring lines on both major surfaces of a membrane contact sheet or by employing a printed wiring board having printed wiring patterns on both sizes thereof. However, such means is unable to simplify the morphology of the membrane contact unit and to reduce the component parts.

SUMMARY OF THE INVENTION

Accordingly, it is an object of the present invention to provide a compact keyboard of a membrane contact type requiring a reduced space for extending wiring lines.

It is another object of the present invention to provide a keyboard of a membrane contact type having wiring lines extended in a simple pattern and in reduced lengths to reduce the resistance of the wiring lines.

It is a further object of the present invention to provide a keyboard of a membrane contact type capable of being formed of a reduced number of parts having simple morphology.

To achieve the object of the invention, a membrane contact unit of the present invention employs a membrane contact sheet having terminal sections respectively for the wiring lines of movable contacts and those of fixed contacts, formed between a movable contact section in which the movable contacts are formed, and a fixed contact section in which the fixed contacts are formed.

That is, the present invention provides a keyboard of a membrane contact type comprising: a membrane contact unit comprising a membrane contact sheet fabricated by forming movable contacts and fixed contacts on one surface of a flexible, insulating, membranous substrate respectively in a movable contact section and in a fixed contact section demarcated by a folding line, the arrangement of the movable contacts and that of the fixed contacts being symmetrical with each other with respect to the folding line, first wiring lines connecting the movable contacts in a predetermined connecting pattern, second wiring lines connecting the fixed contacts in a predetermined connecting pattern, a first terminal section having first terminals respectively connected to the first wiring lines, and second terminal section having second terminals respectively connected to the second wiring lines, and by folding the flexible, insulating, membranous substrate along the folding line so that the movable contact section and the fixed contact section face each other; a spacer having openings and placed between the movable contact section and the fixed contact section so that the openings are disposed in alignment respectively with the movable contacts and the corresponding fixed contacts; and a printed wiring board having a printed wiring pattern and terminals connected to the terminals of the membrane contact unit, and mounted with electronic circuit elements; characterized in that the first and second terminals sections are formed in the vicinity of the folding line of the flexible, insulating, membranous substrate, U-shaped slits are formed in the flexible, insulating, membranous substrate so as to embrace the extremities of the terminals of the first terminal section and the extremities of the terminals of the second terminal section, respectively, so that the first and second terminal sections project from the folded edge of the membrane contact unit for connection to the terminals of the printed wiring board when the flexible, insulating, membranous substrate is folded along the folding line.

In assembling the membrane contact unit, the membrane contact sheet is folded along the folding line, so that the movable contacts and the corresponding fixed contacts are positioned opposite to each other, and the respective ends of the first and second terminal sections project from the folded edge of the flexible, insulating, membranous substrate so that the terminals arranged in the first and second terminal sections can be connected respectively to the terminals of the printed wiring board.

The above and other objects, features and advantages of the present invention will become apparent from the following description taken in conjunction with the accompanying drawings.

DESCRIPTION OF THE PREFERRED EMBODIMENT

Figure 1:
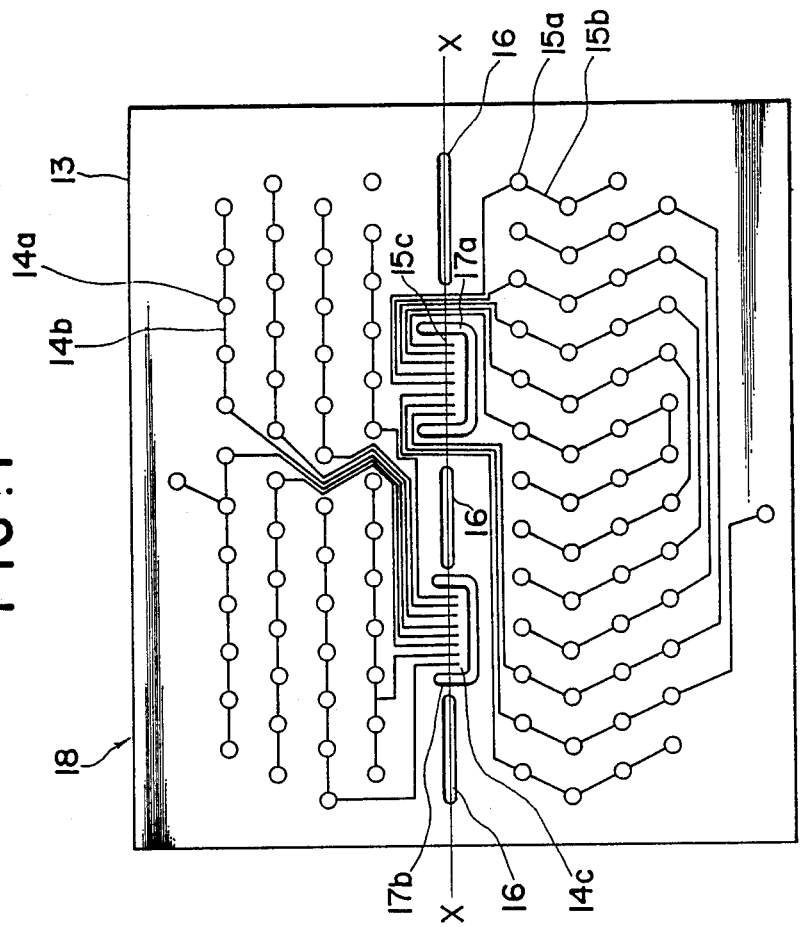
FIG. 1 is a plan view of a membrane contact sheet employed in a keyboard of a membrane contact type, in a preferred embodiment, according to the present invention.

Referring to FIG. 1, a flexible, insulating, membranous substrate 13 has a movable contact section 14 and a fixed contact section 15 demarcated by a folding line x. Movable contacts 14a are arranged in the movable contact section 14. The number of the movable contacts 14a corresponds to that of keys arranged on a keyboard. Fixed contacts 15a are arranged in the fixed contact section 15 so that the movable contacts 14a and the corresponding fixed contacts 15a are disposed opposite to each other when the membranous substrate 13 is folded along the folding line x. The membranous substrate 13 is flexed so that the movable contacts 14a are moved so as to come into contact with the corresponding fixed contacts 15a when the corresponding keys are depressed.

The movable contacts 14a are divided into a plurality of lateral lines, and the movable contacts 14a on each lateral line are connected in series by a first wiring line 14b, while the fixed contacts 15a are divided into a plurality of longitudinal rows, and the fixed contacts 15a on each longitudinal row are connected in series by a second wiring line 15b to form a matrix of contacts.

The first wiring lines 14b for connecting the movable contacts 14a are connected respectively to first terminals arranged in a first terminal section 14c, while the second wiring lines 15b for connecting the fixed contacts 15a are connected respectively to second terminals arranged in a second terminal section 15c. The first terminal section 14c and the second terminal section 15c extend across the folding line x so that the extremities of the first terminals and those of the second terminals are directed in the same direction.

Folding grooves 16 are formed in the membranous substrate 13 along the folding line x to facilitate folding the membranous substrate 13.

The movable contacts 14a, the fixed contacts 15a, the first wiring lines 14b, the second wiring lines 15b, the first terminals of the first terminal section 14c and the second terminals of the second terminal section 15c are printed using a conductive ink, such as a silver paste, on one surface of the membranous substrate 13.

U-shaped slits 17a and 17b are cut in the membranous substrate 13 in the vicinity of the folding line x so as to embrace the extremities of the first terminal section 14c and the second terminal section 15c, respectively.

Figure 2:
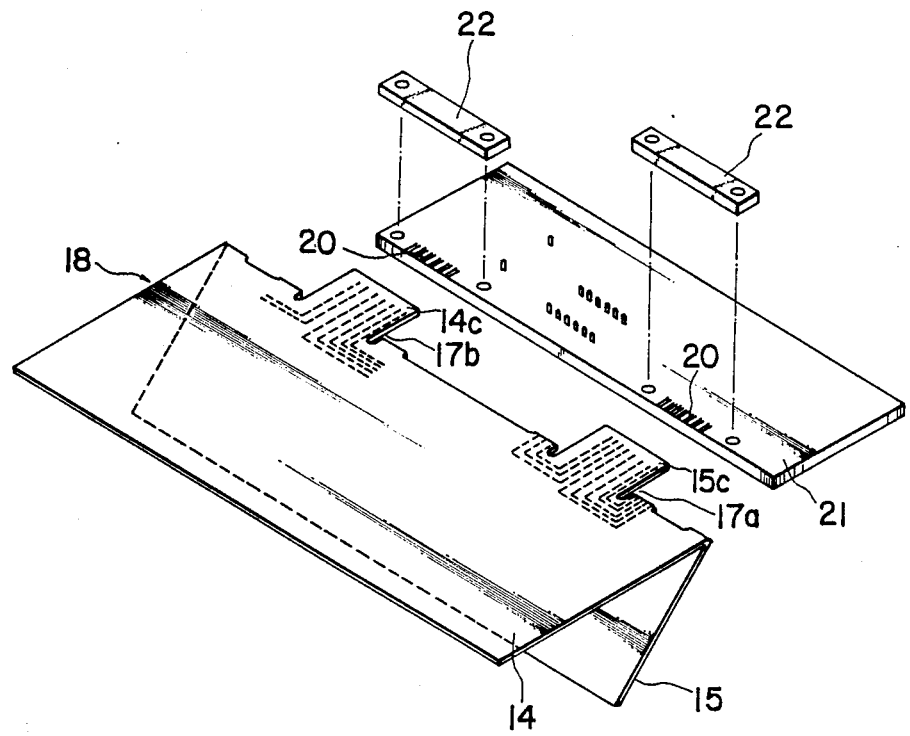
FIG. 2 is an exploded perspective view of assistance in explaining a procedure for assembling the keyboard of a membrane contact type of FIG. 1, wherein a membrane contact unit and a printed wiring board may be connected.

Referring to FIG. 2, the membranous substrate 13 is folded along the folding line x so that the printed surfaces of the movable contact section 14 and the fixed contact section 15 face each other, a spacer 12 having openings formed at positions respectively corresponding to the movable contacts 14a and the corresponding fixed contacts 15a is placed between the movable contact section 14 and the fixed contact section 15, and then the movable contact section 14 and the fixed contact section 15 are joined adhesively to form a membrane contact unit. In this membrane contact unit, the movable contacts 14a correspond respectively to the fixed contacts 15a so that the movable contacts 14a can be brought into contact respectively with the corresponding fixed contacts 15a, and, since the U-shaped slits 17a and 17b are formed in the membranous substrate 13, the first terminal section 14c and the second terminal section 15c are not folded and project from and flush with the movable section 14 when the membranous substrate 13 is folded along the folding line x.

A printed wiring board 21 having electronic circuit elements 19 may be connected to the membrane and is provided with a wiring pattern including terminals 20. In connecting the membrane contact unit to the printed wiring board 21, the first terminal section 14c and the second terminal section 15c are placed directly on the terminals 20 and are held in place by fastening fixing plates 22 to the printed wiring board with screws 23.

Although the U-shaped slits 17a and 17b are formed in the membranous substrate 13 in this embodiment so that the first terminal section 14c and the second terminal section 15c project from and flush with the movable section 14, the U-shaped slits 17a and 17b may be formed so that the first terminal section 14c and the second terminal section 15c project from and flush with the fixed section 15.

Figure 3:
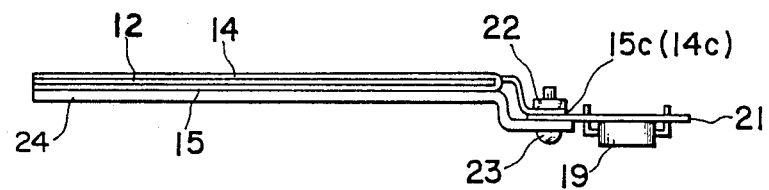
FIG. 3 shows an exemplary method of connecting the membrane contact unit to a printed wiring board.

FIG. 3 shows an exemplary method of connecting the membrane contact unit to a printed wiring board.

Referring to FIGS. 2 and 3, the terminals 20 are formed in a printed wiring board 21, and the terminal sections 14c and 15c of the membrane contact unit are pressed against the terminals 20 at a fixed pressure so that the wiring lines 14b and 15b of the membrane contact unit are connected respectively to the wiring lines of the printed wiring board 21.

Figure 4:
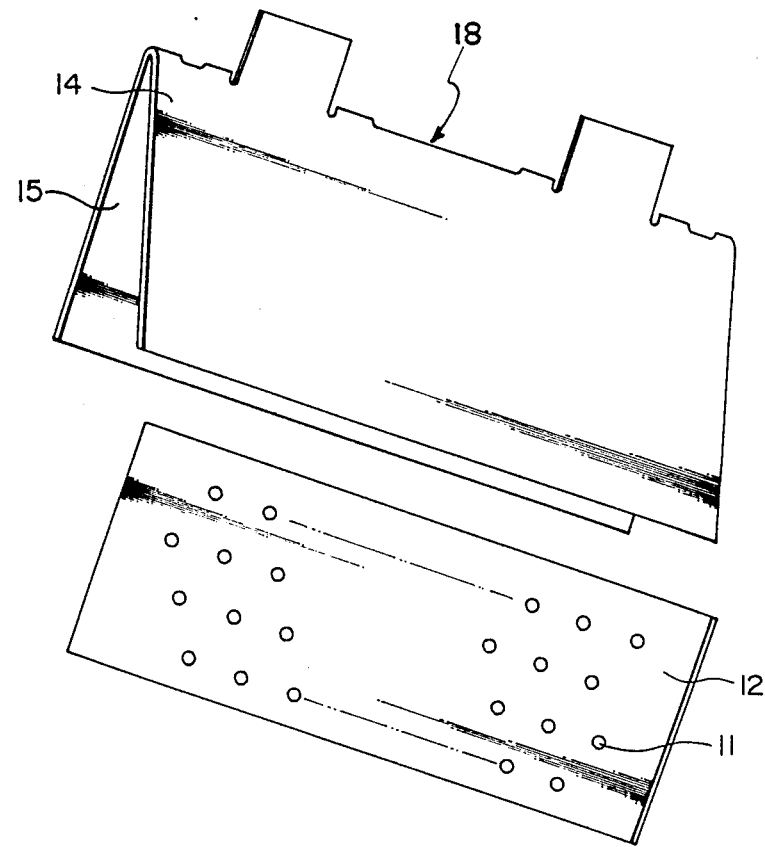
FIG. 4 is an exploded perspective view of assistance in explaining a procedure for assembling a membrane contact unit comprising a membrane contact sheet and a spacer.

Referring to FIG. 4, the membrane contact sheet 18 is folded along the folding line x so that the printed surfaces of the movable section 14 and the fixed section 15 face each other, an insulating spacer 12 having openings 11 formed at positions respectively corresponding to the contacts 14a and 15a is placed between the movable section 14 and the fixed section 15, and then the movable section 14 and the fixed section 15 are joined adhesively to form a membrane contact unit.

Figure 5:
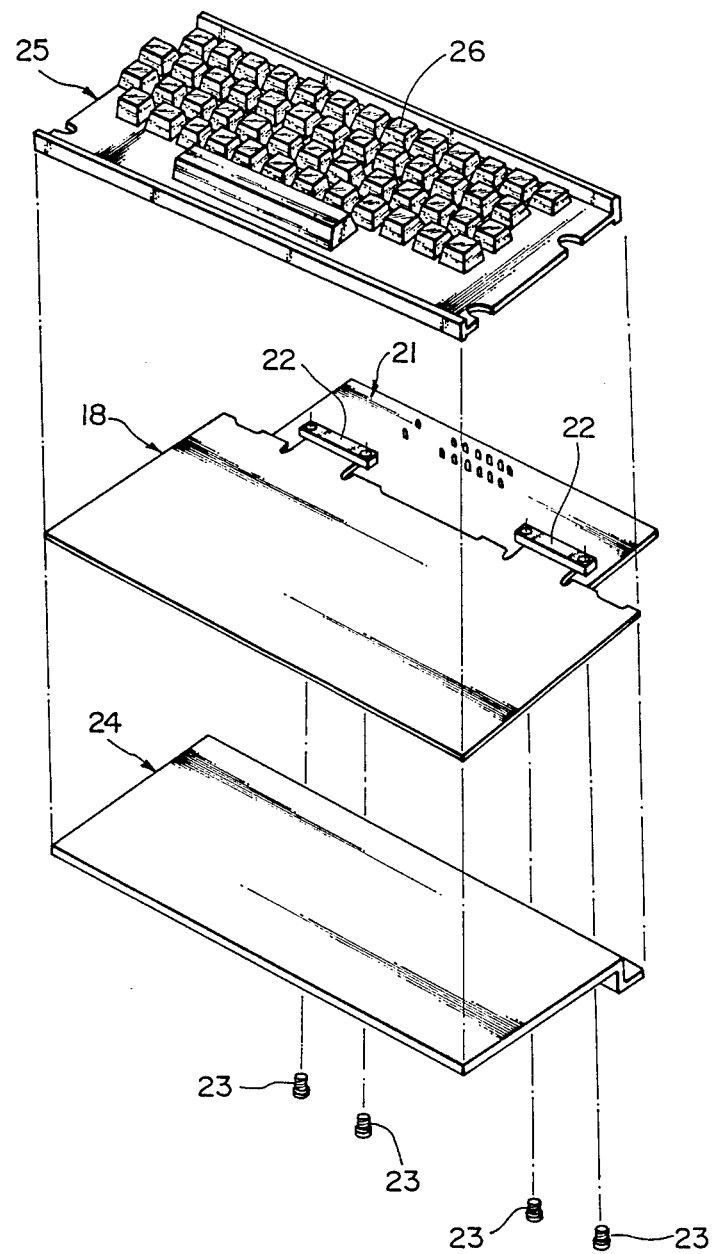
FIG. 5 is an exploded perspective view of a keyboard of a membrane contact type, in a preferred embodiment, according to the present invention.

FIG. 5 is an exploded perspective view showing a keyboard of a membrane contact type, according to the present invention. As obvious from FIG. 5, the membrane contact sheet 18 is placed between a supporting board 24 which is used to fix the membrane contact sheet 18 to the printed wiring board by fastening fixing plates 22 with screws 23, and a keyboard frame 25. Accordingly, each one of the movable contacts 14a is brought into contact with one of the fixed contacts 15a corresponding to the movable contact 14a when a pressure given by input operation is applied to one of the keys 26 corresponding to the movable contact 14a.

Figure 6:
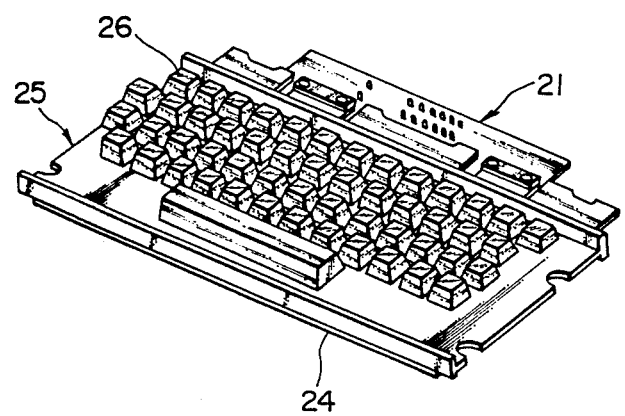
FIG. 6 is a perspective view of an assembled keyboard of a membrane contact type, in a preferred embodiment, according to the present invention.

FIG. 6 is a perspective view showing an assembled keyboard of a membrane contact type, according to the present invention, constituted by the keyboard frame 25, the supporting board 24 and the membrane contact sheet 18, as shown in FIG. 5.

As apparent from the foregoing description, in the keyboard of a membrane contact type according to the present invention, the first and second terminal sections are formed around the folding line of the membranous substrate of the membrane contact sheet, the U-shaped slits are formed so as to embrace the extremities of the first terminals of the first terminal section and those of the second terminals of the second terminal section, respectively, so that the first and second terminal sections project from the membrane contact sheet when the membranous substrate is folded along the folding line, and the first and second terminals of the membrane contact unit are connected directly to the terminals of the printed wiring board.

Since the first and second terminal sections are formed between the movable contact section and the fixed contact section demarcated by the folding line, the wiring lines can be formed in the least necessary lengths, in a simple wiring pattern and in the least necessary space. Thus, the keyboard of a membrane contact type can be formed in a compact construction.

Furthermore, since the wiring lines of the membrane contact unit are formed respectively in the least necessary lengths, the resistance of the wiring lines is reduced to the least possible extent.

Still further, since the movable contacts, the fixed contacts, the wiring lines and the first and second terminals of the membrane contact unit are formed on one surface of the membranous substrate, the membrane contact unit can be formed in a simple morphology, and the membrane contact unit can be connected to the printed wiring board by simple means.

Although the invention has been described in its preferred form with a certain degree of particularity, obviously many variations and changes are possible therein. It is therefore to be understood that the present invention may be practiced otherwise than specifically described herein without departing from the scope and spirit thereof.

What is claimed is:

1. A keyboard of a membrane contact type comprising:
   (a) a membrane contact unit comprising:
      a flexible, insulating, membranous substrate having a movable contact section and a fixed contact section demarcated by a folding line, and folded along said folding line,
      a plurality of movable contacts formed on one surface of said flexible, insulating, membranous substrate in said movable contact section and divided into a plurality of lateral lines,
      a plurality of fixed contacts formed on the same surface as said movable contacts in said fixed contact section and divided into a plurality of longitudinal rows,
      first wiring lines formed in said movable contact section and each connecting the movable contact on each lateral line in series,
      second wiring lines formed in said fixed contact section and each connecting the fixed contact on each longitudinal row in series,
      a first terminal section having a plurality of first terminals respectively connected to said first wiring lines, and formed in the vicinity of said folding line,
      a second terminal section having a plurality of second terminals respectively connected to said second wiring lines, and formed in the vicinity of said folding line,
      a spacer having openings and placed between said movable contact section and said fixed contact section so that said openings are aligned respectively with said movable contacts and the corresponding fixed contacts; and
   (b) a printed wiring board having electronic circuit elements and provided with printed wiring pattern and terminals connected to said plurality of first and second terminals of said membrane contact unit.

2. A keyboard of a membrane contact type, according to claim 1, wherein a first U-shaped slit is formed in the vicinity of said folding line so as to embrace the extremity of said first terminal section, and a second U-shaped slit is formed in the vicinity of said folding line so as to embrace the extremity of said second terminal section.

3. A keyboard of a membrane contact type, according to claim 2, wherein said extremities of said first and second terminal sections project from the folded edge of said membrane contact unit by said first and second U-shaped slits respectively, for connection to said terminals of said printed wiring board when said flexible, insulating, membranous substrate is folded along said folding line.

* * * * *